(12) United States Patent
Scholz et al.

(10) Patent No.: US 8,675,315 B2
(45) Date of Patent: Mar. 18, 2014

(54) MAGNETIC SENSOR WITH ANISOTROPIC LINER

(75) Inventors: Werner Scholz, Edina, MN (US);
Michael C. Kautzky, Eagan, MN (US);
Sarbeswar Sahoo, Shakopee, MN (US);
Mark T. Kief, Lakeville, MN (US);
James G. Wessel, Savage, MN (US)

(73) Assignee: Seagate Technology LLC, Cupertino, CA (US)

( * ) Notice: Subject to any disclaimer, the term of this patent is extended or adjusted under 35 U.S.C. 154(b) by 58 days.

(21) Appl. No.: 13/194,793

(22) Filed: Jul. 29, 2011

(65) Prior Publication Data

US 2013/0027812 A1 Jan. 31, 2013

(51) Int. Cl.
*G11B 5/33* (2006.01)
(52) U.S. Cl.
USPC .......................................... 360/319
(58) Field of Classification Search
USPC .......................................... 360/319
See application file for complete search history.

(56) References Cited

U.S. PATENT DOCUMENTS

| | | | |
|---|---|---|---|
| 5,187,628 A | 2/1993 | Kanai et al. | |
| 5,326,637 A | 7/1994 | Nasu et al. | |
| 5,576,914 A | 11/1996 | Rottmayer et al. | |
| 5,818,685 A * | 10/1998 | Thayamballi et al. | 360/324 |
| 6,156,422 A | 12/2000 | Wu et al. | |
| 6,771,567 B2 | 8/2004 | Nozieres et al. | |
| 6,939,626 B2 | 9/2005 | Tang | |
| 7,035,062 B1 * | 4/2006 | Mao et al. | 360/324.2 |
| 7,573,684 B2 * | 8/2009 | Seigler et al. | 360/322 |
| 7,576,948 B2 * | 8/2009 | Covington et al. | 360/112 |
| 7,719,802 B2 * | 5/2010 | Kautzky et al. | 360/324.2 |
| 2004/0105196 A1 | 6/2004 | Kataoka | |
| 2006/0198059 A1 | 9/2006 | Sakai et al. | |
| 2006/0199043 A1 | 9/2006 | Sugimoto et al. | |
| 2007/0002481 A1 | 1/2007 | Kikitsu et al. | |
| 2007/0139826 A1 | 6/2007 | Carey et al. | |
| 2010/0165510 A1 | 7/2010 | Takahashi et al. | |

* cited by examiner

*Primary Examiner* — Mark Blouin
(74) *Attorney, Agent, or Firm* — Hall Estill Attorneys at Law

(57) ABSTRACT

An apparatus and associated method are generally directed to a magnetic sensor constructed with an anisotropic liner capable of screening magnetic flux. Various embodiments can have a data read element positioned on an air bearing surface adjacent a magnetic shield which is at least partially lined with an in-plane anisotropy layer.

20 Claims, 5 Drawing Sheets

FIG. 1
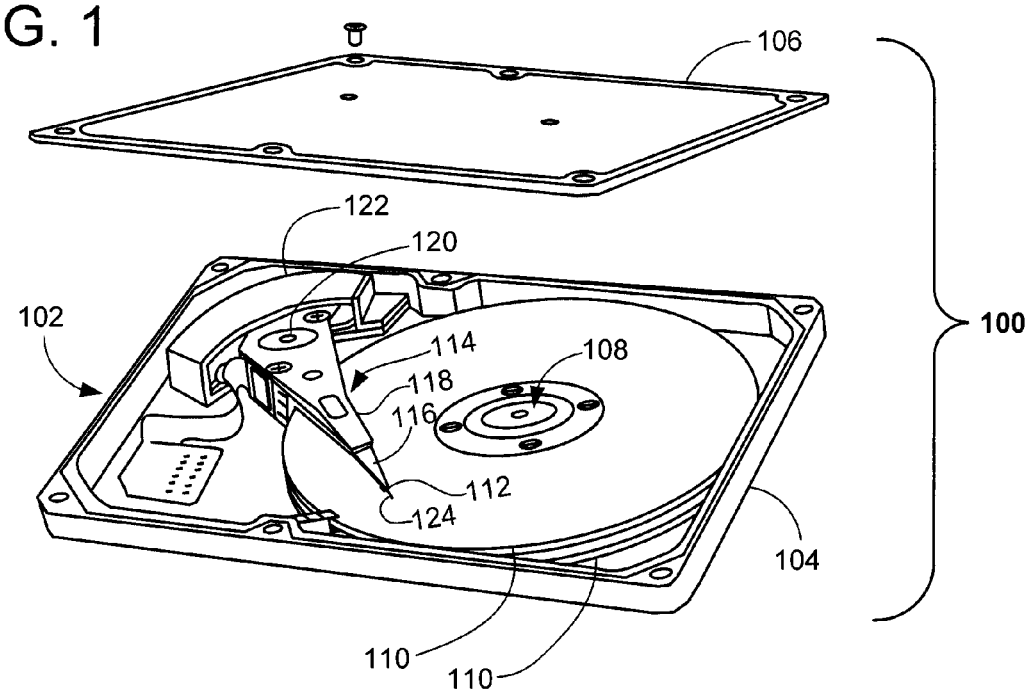
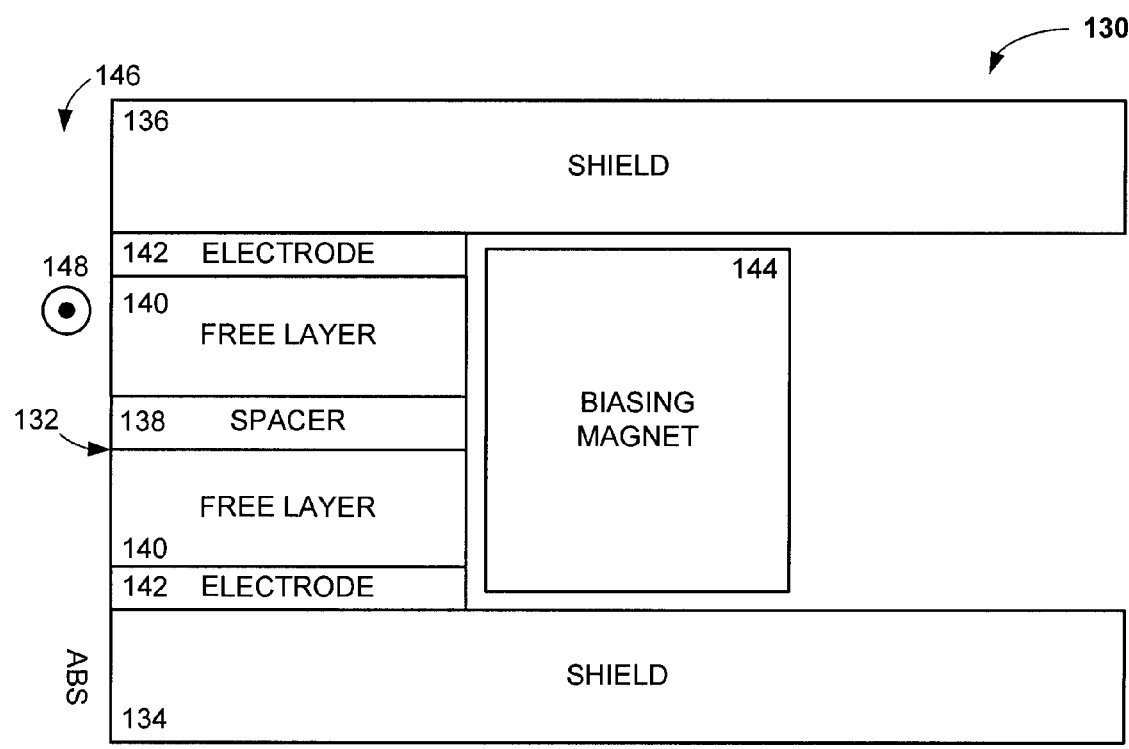
FIG. 2

MAGNETIC SENSOR WITH ANISOTROPIC LINER

SUMMARY

A magnetic sensor can be constructed with an anisotropic liner that is capable of screening magnetic flux. Various embodiments may have a data read element positioned on an air bearing surface adjacent a magnetic shield which is at least partially lined with an in-plane anisotropy layer.

BRIEF DESCRIPTION OF THE DRAWINGS

FIG. 1 is a perspective view of an example data storage device.

FIG. 2 shows a magnetic sensor as constructed and operated in accordance with various embodiments of the present invention.

DETAILED DESCRIPTION

Figure 3:
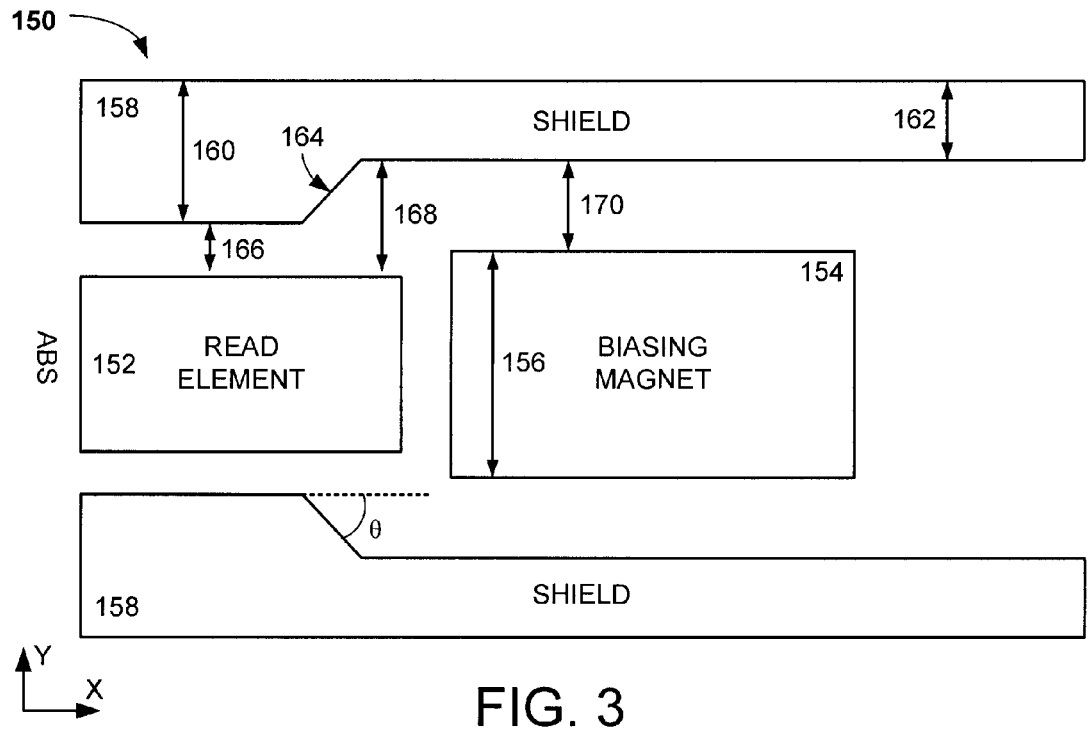
FIG. 3 shows a magnetic sensor constructed and operated in accordance with various embodiments of the present invention.

The present disclosure generally relates to shielding magnetic flux in magnetic sensors. As industry demand increases for larger data capacity and faster data transfer rates, form factors of various data storage components, such as read elements and shield-to-shield spacing, decrease. Such smaller shield-to-shield spacing may reduce the magnetic field sensed during operation and thus degrade performance of a data storage device. As such, construction of readers with reduced shield-to-shield spacing that can maintain strict shielding characteristics and enhanced data transfer rates in reduced form factor data storage devices is in increasing demand in the industry.

Accordingly, a magnetic shield with a liner that exhibits high in-plane anisotropy can shield unwanted external magnetic fields while maintaining a strong readback signal. A magnetic sensor can be constructed with a data read element positioned on an air bearing surface adjacent a magnetic shield that is at least partially lined with an in-plane anisotropy layer. The anisotropic layer may provide enhanced data read performance with minimal increase in sensor thickness (shield-to-shield spacing) due to the combination of a macro magnetic flux shielding from the magnetic shield and micro magnetic flux shielding from the anisotropic liner.

By orienting in-plane anisotropy of the liner parallel to the longitudinal plane of the shield that runs perpendicular to the air bearing surface, the magnetic stability of a magnetic sensor can be optimized, especially in reduced form factor data storage devices. The in-plane anisotropy can further enhance operational characteristics of the data read element by improving readback performance through reduction of the attenuation of magnetic flux from data bits, which can produce a larger sensed magnetic field and signal amplitude.

In FIG. 1, an embodiment of a data storage device 100 is provided. The device 100 shows a non-limiting environment in which various embodiments of the present invention can be practiced. The device 100 includes a substantially sealed housing 102 formed from a base deck 104 and top cover 106. An internally disposed spindle motor 108 is configured to rotate a number of magnetic storage media 110. The media 110 are accessed by a corresponding array of data transducers (read/write heads) that are each supported by a head gimbal assembly (HGA) 112.

Each HGA 112 can be supported by a head-stack assembly 114 ("actuator") that includes a flexible suspension 116, which in turn is supported by a rigid actuator arm 118. The actuator 114 may pivot about a cartridge bearing assembly 120 through application of current to a voice coil motor (VCM) 122. In this way, controlled operation of the VCM 122 causes the transducers (numerically denoted at 124) to align with tracks (not shown) defined on the media surfaces to store data thereto or retrieve data therefrom.

FIG. 2 generally illustrates an embodiment of a magnetic sensor 130 capable of being used in the data storage device of FIG. 1. The sensor can be constructed, as shown, with a magnetic sensing stack 132 disposed between first and second magnetic shields 134 and 136. Construction of the magnetic stack 132 is unlimited and can be a lamination of any number of layers with any magnetic orientation that is magnetically responsive. One such construction has a non-magnetic spacer layer 138 disposed between dual magnetically free layers 140 that are each attached to electrodes 142, which can be a variety of different orientations and materials, such as cap and seed layers.

With the presence of magnetically free layers 140 without a fixed magnetization in the magnetic stack 132 to be used as a reference, a permanent magnet 144 can be positioned adjacent the stack 132 opposite from the portion that contacts an air bearing surface (ABS) 146 to impart a magnetic bias force on the free layers 140 without affecting the operational characteristics of the ABS side of the stack 132. That is, the free layers 140 are biased by the permanent magnet 144 to a default magnetization that allows accurate sensing of data bits across the ABS 146.

The magnetic sensor 130 can operate to sense data bits passing within the shield-to-shield spacing (SSS) of the sensor 130 and within a predetermined track width 148 while blocking distal data bits generated from outside of the track with the magnetic shields 134 and 136. Thus, the operation of the magnetic shields 134 and 136 allows the stack 132 to sense only the magnetic fields within the SSS and predetermined track 138, which is particularly pertinent with the increasing demand for high density data storage devices. However, construction of the magnetic shields 134 and 136 with isotropic material, such as Nickel-Iron compounds and Permalloy, can cause the loss of magnetic strength in both the permanent magnet 144 and stack 132. Such a loss in magnetic strength can inhibit optimal function of the sensor 130 due to magnetic stability and reduced sensing margin.

In some embodiments, the loss of magnetic strength is mitigated by modifying the distance between the magnetic shields 134 and 136 to the stack 132 and permanent magnet 144 distal to the ABS. FIG. 3 displays an example magnetic sensor 150 constructed with such modified distances. The sensor 150 has a data read element 152 with an ABS on one side and a biasing magnet 154 adjacent the side opposite the ABS. While the read element 152 and biasing magnet 154 can be any size, shape, and orientation, in some situations the biasing magnet has a greater length 156, along the Y axis parallel the ABS, than the read element 152.

The increased length 156 of the biasing magnet 154 can more efficiently bias the read element 152, but can also produce magnetic shunting between the magnet 154 and one or both magnetic shields 158, which can reduce biasing strength of the read element 152 and degrade sensor performance. To decrease and eliminate such shunting, one or both shields 158 can have a varying thickness, along the Y axis, that is tuned to produce predetermined distances between the shield 158 and the read element 152 and biasing magnet 154 to optimize read element performance.

Each modified magnetic shield 158 can be configured with a first thickness 160 proximal to the ABS and a second thickness 162 distal to the ABS. The first and second thicknesses 160 and 162 can be connected by a transition region 164 that can be shaped in an unlimited number of configurations, such as curvilinear and linear, that tune and optimize read element 152 performance. In the embodiment shown in FIG. 3, the transition region 164 has a continually uniform linear slope angled at a predetermined θ degree with respect to the X axis orthogonal to the ABS.

With the transition region 164 configuration, the magnetic shield 158 can be precisely oriented first and second distances 166 and 168 from the read element 152 as the shield 158 translates from the first thickness 160 to the second thickness 162, which can allow for increased space for the biasing magnet 154 to efficiently impart a default magnetization in the read element 152. The unrestricted ability to tune the magnetic shields 158, either independently or in combination, with various distances can continue with the orientation of a third distance 170, which can be the same or different from the first and second distances 166 and 168, measured between the biasing magnet 154 and shield 158.

The number and size of the distances 166, 168, and 170 can provide performance enhancing spacing that maintains strict shielding characteristics at the ABS and reduces magnetic shunting while allowing efficient interaction between the read element 152 and biasing magnet 154. However, tuned spacing of the magnetic shields 158 can be insufficient, in some scenarios such as greatly reduced form factor magnetic sensors, to optimize performance of the read element 152.

Accordingly, the use of a material with high in-plane anisotropy to line one or both shields 158 of the magnetic sensor 150 can provide an additional level of magnetic stability to optimize read element 152 operation. By utilizing the magnetic shields 158 that macroscopically block magnetic flux, but can be susceptible to absorbing biasing magnetization, in combination with a high anisotropic liner that shields flux with minor magnetic absorption, performance of the read element can be optimized to a variety of form factors and operational environments.

Figure 4:
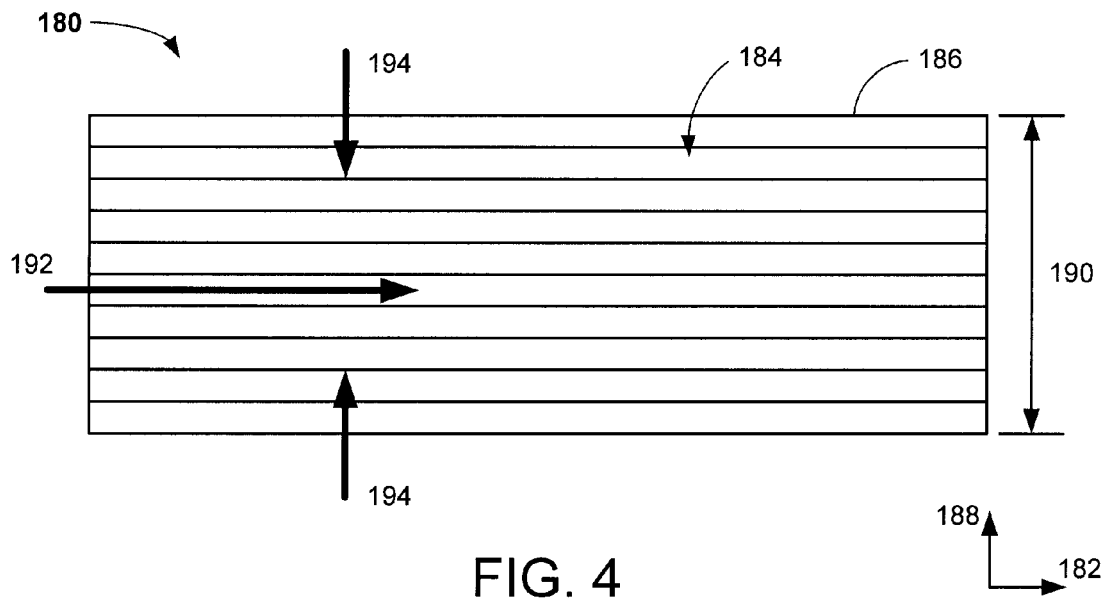
FIG. 4 generally illustrates a magnetic shield capable of deflecting unwanted flux in various embodiments.

FIG. 4 displays a block representation of an example magnetic shield liner 180 capable of being used with the magnetic shields 158 of FIG. 3. The magnetic shield liner 180 can be made from a variety of materials, such as a Cobalt-Iridium compound like $CoIr_x$, with x being 5% to 50% (atomic percent), that exhibit high in-plane anisotropy with an anisotropy axis parallel to axis 188. Other materials may include, but are not limited to, multilayers of magnetic material (e.g. NiFe, Fe, FeCo) with non-magnetic spacer layers (e.g. Cu), which can be used for the liner 180. As shown, the anisotropy 184 of the shield liner 180 may result in high longitudinal magnetic permeability that runs parallel to the axis 182 in any direction along a plane perpendicular to axis 188. Conversely, the anisotropy 184 may result in low permeability along a transverse axis 188 of the shield liner 180 that runs parallel to the thickness 190 of the shield liner 180.

The high degree of anisotropy that corresponds with the longitudinal axis 182 of shield liner 180 can be characterized as "$-K_u$," which corresponds with negative anisotropy along the transverse axis 188 of the shield liner 180. The anisotropic characteristics of the shield liner 180 provide consistent operational behavior in which longitudinal external magnetic fields, such as magnetic flux 192, are easily transmitted through the liner 180 due to the high permeability along the longitudinal axis 182. In effect, the high permeability along longitudinal axis 182 magnifies incident magnetic fields along the axis 182. In contrast, transverse external magnetic fields, such as magnetic flux 194, experience low permeability and thus low magnification due to the negative anisotropy that is aligned along the longitudinal axis 182.

In a non-limiting general comparison, the magnetic shield liner 180 exhibits structural and operational characteristics that are dissimilar from an isotropic magnetic material such as the NiFe and Permalloy that can make up magnetic shields, like shields 158 of FIG. 3. As can be appreciated, a material with isotropic magnetic properties has no directional dependence through the material and magnetism can migrate through the material without experiencing a "hard" or "easy" axis that either facilitates or resists transmission.

While isotropic materials can have a small degree of anisotropy in which one plane is easier for magnetic transmission than another, such material does not have the substantial anisotropic strength of the liner 180 of FIG. 4, which exhibits clear magnetic pathways with anisotropy 184 that define an "easy" and "hard" direction through the liner 180 as corresponding to either the longitudinal axis 182 or transverse axis 188, respectively.

A magnetic shield liner 180, as shown, provides structural and operational characteristics that are also dissimilar from a uniaxial magnetic material that exhibit an easy axis, which fundamentally differs from the high anisotropic plane of $-Ku$ materials. The magnetic moment of these materials tends to align with the easy axis while not providing the amplitude gains that are afforded by $-Ku$ materials.

However, the liner 180 is not limited to the anisotropic alignment shown in FIG. 4. The anisotropy 184 can be aligned along the transverse axis 188 or with any other angular dimension, such as an axis orthogonal to the transverse and longitudinal axis 188 and 182. Thus, the directional dependence of the liner 180 corresponds with high anisotropy that can be present in any direction. As such, a "hard" axis and perpendicular "easy" plane can be present in the liner 180, irrespective of the particular direction of the anisotropy 184. Accordingly, the shield liner 180 may be tuned through various configurations to accommodate a variety of magnetic transmission properties that can provide optimized operation.

Figure 5:
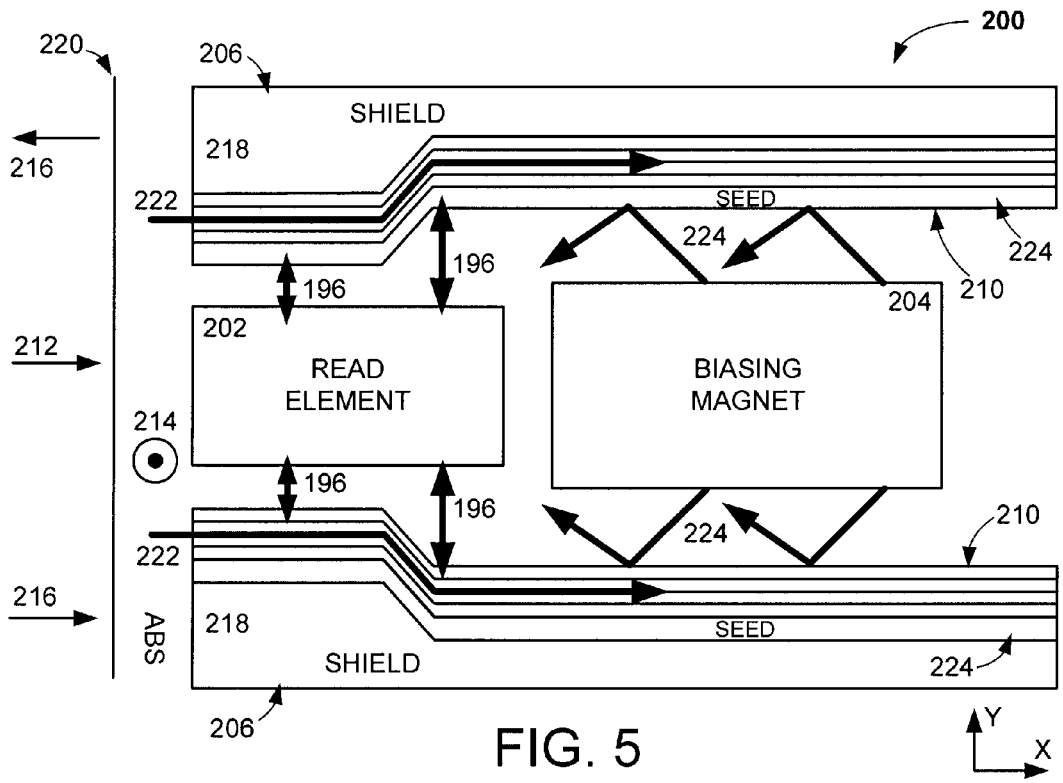
FIG. 5 provides a magnetic sensor capable of being used in the data storage device of FIG. 1.

FIG. 5 generally displays operation of an example magnetic sensor 200 constructed in accordance with various embodiments. The sensor 200 has a data read element 202 and biasing magnet 204 disposed between shield laminations 206 that are each shaped with transition regions 208 and lined with highly anisotropic layers 210. As the sensor 200 encounters an external data bit, such as bit 212, which is within the predetermined data track 214, the read element 202 will sense the magnetic orientation of the bit 212, such as logical state 0 or 1, while the shield laminations 206 block the sensing of distal data bits 216.

The blockage of the distal data bits 216 can be attributed to the tuned configuration of the isotropic shield layer 218 that is continuously lined with anisotropic material 210 substantially along the X axis. Such continuous anisotropic lining 210 positioned between the isotropic shield layer 218 and the read element 202 and biasing magnet 204 can be constructed with any thickness, or varying thickness, but may be very thin, such as 30 nm, due to the highly efficient magnetization diffusion of the anisotropic liner 210, which transmits each of the distal bit's 216 magnetizations along the length of the shield laminations 206 without affecting the read element 202.

That is, the combination of the isotropic shield layer 218 with the high magnetic permeability of the shield liner 210 along the X axis that is perpendicular to the surface of the storage media 220 allows for distal magnetic fields 222 outside the track 214 to be easily diverted away from the read element 202. The combination of isotropic shield 218 and anisotropic liner 210 further may provide more efficient utilization of the biasing magnet 204 to produce a more magnetically stable read element 202 as biasing magnetic field 224 is attenuated less towards the read element 202 due to the in-plane anisotropy of the liner 210 instead of being absorbed by the isotropic shield layer 210.

Absorption of magnetic field into isotropic shields can similarly plague the read element 202 with gradual or sudden loss of magnetic energy. The migration of element magnetization toward the isotropic shield layers 218 reduces the operational margin that allows for the detection and characterization of the magnetic orientation of the data bit 212. With the addition of the highly anisotropic shield liner 210, the orientation of the anisotropy along the stripe height (longitudinal axis of the stack) retains magnetic field in the element 202. As a result, the magnetization of the read element 202 may respond to a stronger field from bit 212, which results in higher readback amplitude. Thus, the operational margin is maintained consistently and the element reliably senses programmed data bits 212.

While the anisotropic shield liners 210 can be constructed and configured in a number of different, non-limiting, manners, various embodiments deposit a liner seed layer 224 before creating the anisotropic shield liner 210. Such liner seed layer 224 can be a variety of different magnetic and non-magnetic materials, such as a metal and Tantalum, that can be chosen to provide various structural and performance enhancements, such as predetermined texture and interaction with the in-plane anisotropic material of the shield liner 210.

The seed liner layers 224 can be positioned in any location adjacent the anisotropic liner, but in some embodiments is formed below the liner 210 with respect to the Y axis to allow the liner 210 to be created atop the liner seed layer 224. As shown, such lower placement of the liner seed layer 224 can position it between the liner 210 and the isotropic shield 218 or between the liner 210 and the operating cavity that includes at least the read element 202 and the biasing magnet 204.

Figure 6A:
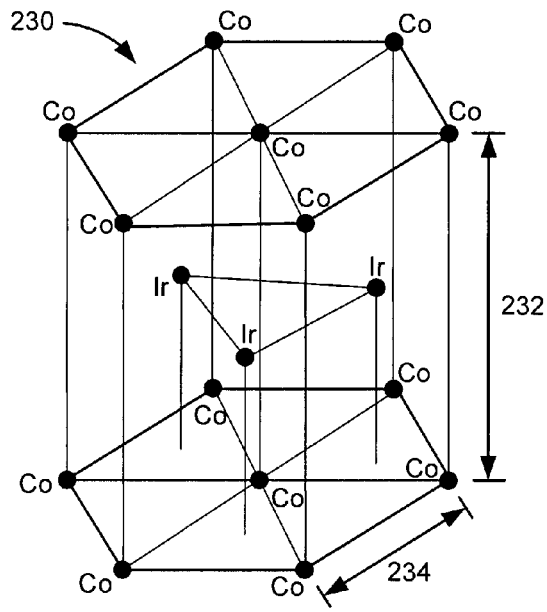
FIGS. 6A and 6B show structural characteristics of a material capable of being used as the magnetic shield in the various embodiments of FIG. 2.
Figure 6B:
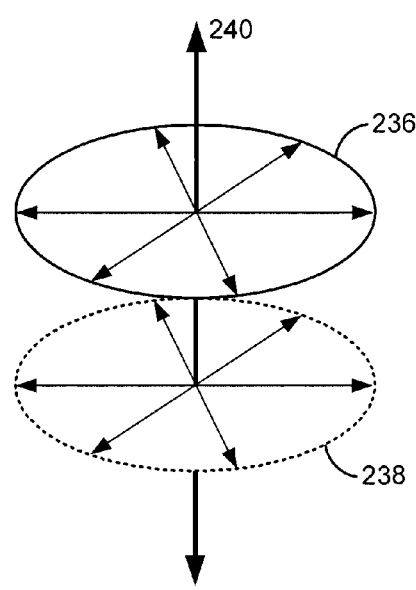

FIGS. 6A and 6B depict structural characteristics of a Cobalt-Iridium material 230 that can be used in various embodiments of the present invention. As shown in FIG. 6A, a non-limiting point representation of the Cobalt-Iridium material 230 displays an elongated hexagonal shape. That is, the material 230 has a length 232 that is greater than any one of the hexagonal sides 234. Such structural configuration of the material 230 allows for high anisotropy with the creation of easy plane and hard magnetic axis, as generally displayed in FIG. 6B.

Various non-limiting magnetic characteristics of the material 230 are shown in FIG. 6B. The elongated structure of the material 230 corresponds with an easy magnetic plane 236 that have high magnetic permeability, as shown by either plane 236 or 238, positioned anywhere along the axis of rotation 240. Furthermore, the material 230 has a hard magnetic axis that is perpendicular to the easy plane 236 and parallel to the axis of rotation 240. With such natural formation of easy plane and a hard magnetic axis, a magnetic element can be easily constructed with various layer deposition processes involving the material 230.

Figure 7A:
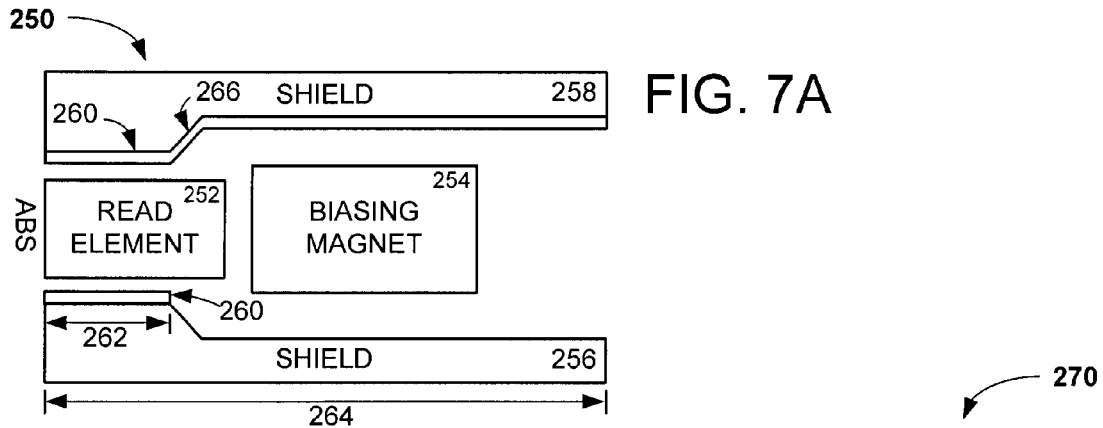
FIGS. 7A-7D display example magnetic sensor configurations in accordance with various embodiments of the present invention.

FIGS. 7A-7D generally illustrate cross-sectional views of how the structural characteristics of any highly in-plane anisotropic material can be used in various magnetic sensor configurations to tune and optimize data sensing performance. FIG. 7A shows magnetic sensor 250 with a read element 252 and biasing magnet 254 disposed between top and bottom shields 256 and 258 that each have increasing thicknesses distal to the ABS.

Each shield 256 and 258 is lined with different lengths of anisotropic material 260. The top shield 256 is continuously lined for a first length 262 along the increased thickness portion of the top shield 256 while the bottom shield 258 is continuously lined for the entire stripe height 264 of the bottom shield 258, including the transition region 266 where the shield translates from the first thickness to the lesser second thickness. The ability to tune the anisotropic liner to a variety of lengths along the shields can allow for optimization of the read element 252 and biasing magnet 254 performance.

Figure 7B:
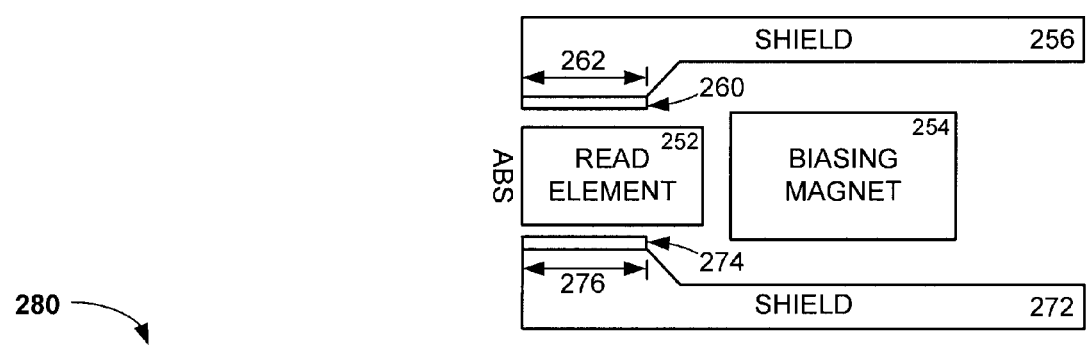

FIG. 7B displays magnetic sensor 270 which has a similar top shield 256 as FIG. 7A separated from a bottom shield 272 that is partially lined with high in-plane anisotropic material 274. While the anisotropic materials 260 and 274 can continuously extend a common length orthogonal to the ABS, the bottom shield 272 can be configured to have a greater anisotropic liner length 276, which may correspond to a longer first thickness for the bottom shield 272.

Lining each shield 256 and 272 only along the thicker portions proximal to the ABS and read element 252 may provide enhanced shielding close to the sensed data bits while preventing the biasing magnet 254 from imparting too much magnetization on the read element 252 as bias magnetic flux is partially absorbed by the shields 256 and 272.

Figure 7C:
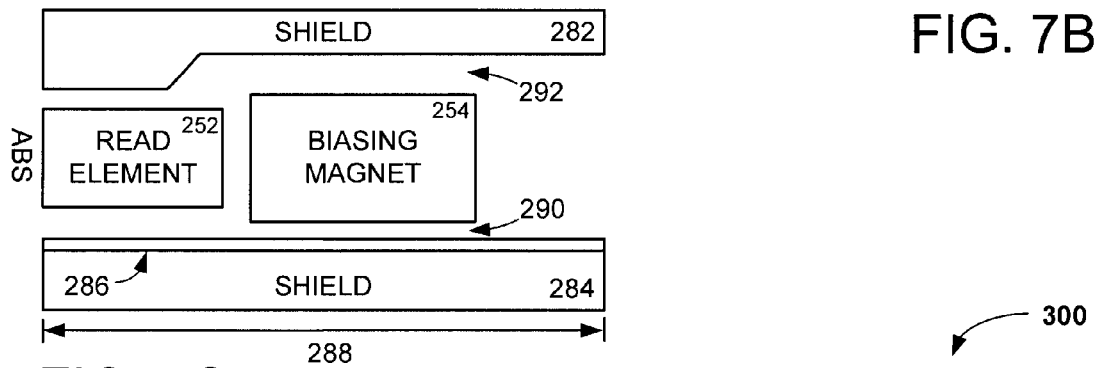

In FIG. 7C, a magnetic sensor 280 is displayed with a varying thickness top shield 282 that is unlined and a uniform thickness bottom 284 shield that is continuously lined with a high in-plane anisotropic material 286 along its stripe height 288. The use of a uniform thickness bottom shield 284 can provide varying distances 290 and 292 between the biasing magnet 254 and the shields 282 and 284. The adjustment of distances 290 and 292 further allows tuning an optimization of bias magnet 254 and read element 252 performance as the anisotropic liner 286 can produce different operational characteristics, such as magnetization redirection, from the unlined isotropic top shield 282.

Figure 7D:
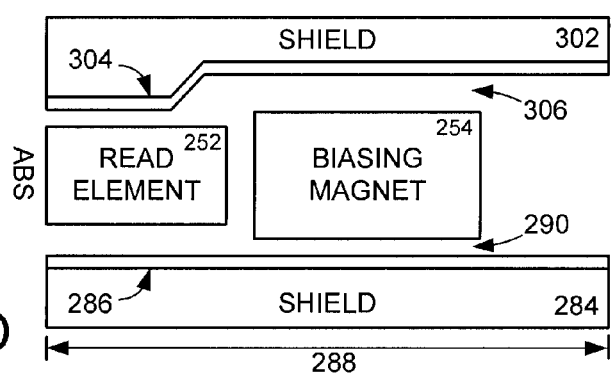

The uniform bottom shield 284 of FIG. 7C can be configured in a magnetic sensor 300 with a top shield 302 that is partially or fully lined with high in-plane anisotropic material 304, as displayed in FIG. 7D. As shown, the read element 252 and biasing magnet 254 are disposed between continuously lined shields 284 and 302 that are spaced at different distances 290 and 306 due to the varying thicknesses of the top shield 302. As with magnetic sensor 280, the ability to tune the spacing between the shields 284 and 302, read element 252, and biasing magnet 254 can allow for optimization of performance by manipulating the behavior of bias and read element magnetization.

It should be noted that the various magnetic sensor configurations of FIGS. 7A-7D are merely examples of shields and are in no way limiting or restricting. In fact, the various configurations of varying thickness shields, partially lined, unlined, and uniform thickness shields can be used in at least 36 different combinations that can each be uniquely tuned to provide specific performance characteristics to accommodate operational environments, such as reduced form factor and increased data transfer rate data storage devices. Further of note is the characterization of "top" and "bottom" shields, which are in no way limited to a particular orientation with respect to the read element 252 and can be interchanged at will.

In some embodiments, the high in-plane anisotropic material lining is $CoIr_{17}$, which fundamentally differs from the isotropic shields that exhibit anisotropic behavior. A magnetically isotropic material can be configured to exhibit a degree of anisotropy, but such configuration will not provide the operational benefits of high amplitude with narrow PW50. In other words, formatting materials to exhibit anisotropy lowers or maintains pulse amplitude and widens PW50 to the detriment of the element's operational characteristics. In contrast, high in-plane anisotropic materials such as $CoIr_{17}$ exhibit high amplitude and narrow PW50 due to natural compound structure, which illustrate the unique operational benefits of such materials over existing magnetic shields.

Figure 8:
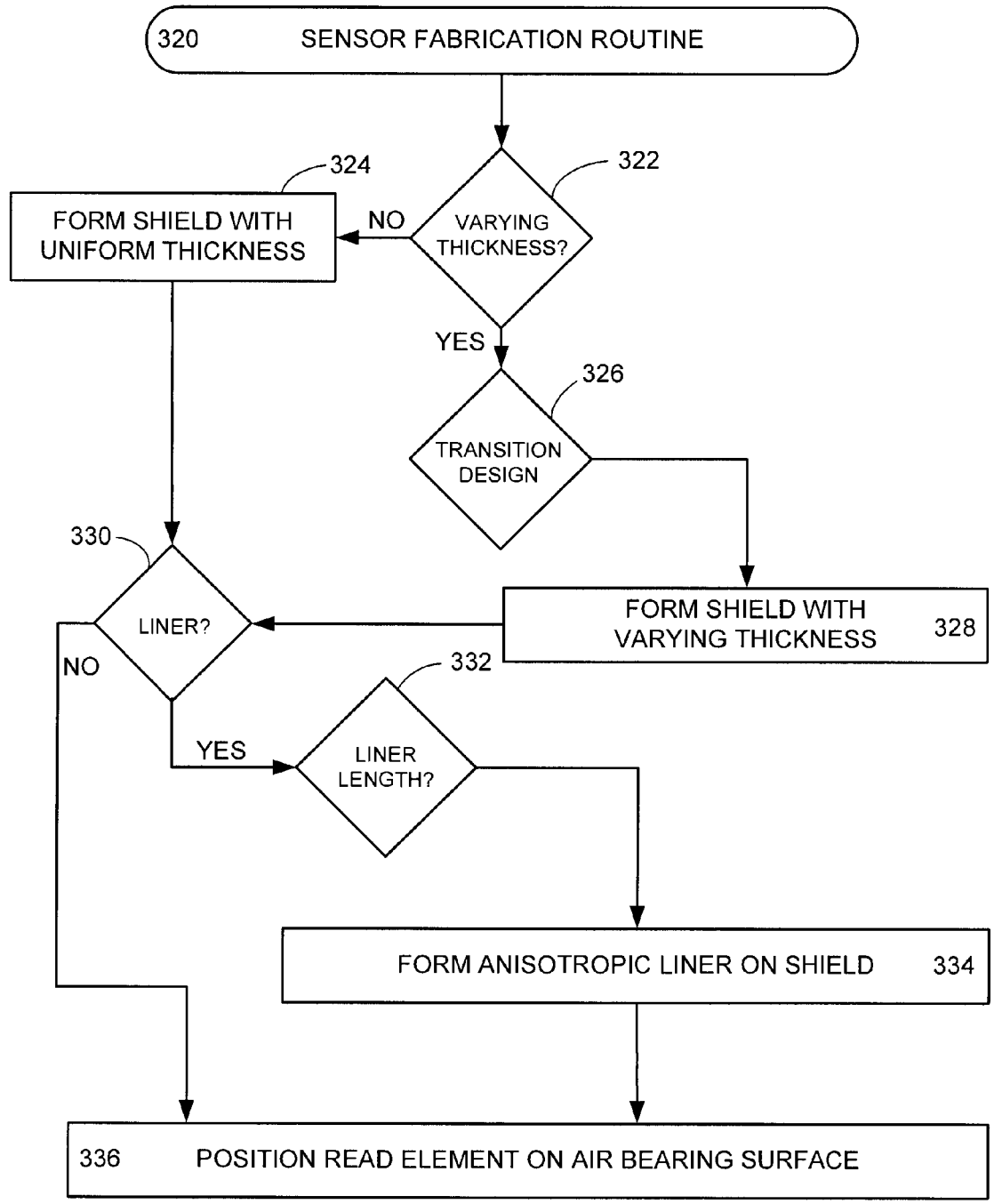
FIG. 8 provides a flowchart of a magnetic sensor fabrication routine carried out in accordance with various embodiments of the present invention.

FIG. 8 provides an example flowchart of a sensor fabrication routine 320 conducted in accordance with various embodiments of the present invention. Initially, the routine 320 in decision 322 if a magnetic shield layer installed about the read element is to have a varying thickness, as generally illustrated in FIG. 3. If a non-varying thickness is to be used, step 324 then forms a shield with a uniform thickness on the air bearing surface proximal to the read element, as displayed by shield 284 in FIG. 7C.

However, if a varying thickness shield is to be formed, decision 326 further designs the transition between the various shield thicknesses. That is, decision 326 evaluates how the different thicknesses are to be joined, such as by a continuously linear slope as in FIG. 3 or a curvilinear portion. Completion of the design of the varying thicknesses and transition region of the shield advances routine 320 to step 328 where the predetermined shield is formed on the air bearing surface proximal to the data read element.

Whether a shield is formed with a uniform thickness in step 324 or with a varying thickness in step 328, decision 330 then evaluates if an anisotropic liner is to be formed partially or wholly on the previously deposited shield. In the event an anisotropic liner is to be installed, decision 332 proceeds to determine the length of liner with respect to the longitudinal axis of the shield, orthogonal to the air bearing surface. The decided upon liner length is then formed on the shield in step 334, which can result in a number of different shield and liner orientations as generally displayed by FIGS. 7A-7D.

With the magnetic shield formed, step 336 positions a data read element on an air bearing surface. As discussed above, the read element may have a plurality of magnetically free layers configured in a trilayer that is biased to a default magnetization by a separate biasing magnet that may, or may not, be formed and positioned in step 336. The routine 320 can terminate with the existing shield and read element orientation to be installed and used in a data storage device.

However, choosing another shield to be formed advances the routine 320 back through the various decisions in reverse order that corresponds to depositing the liner before the shield, which corresponds to bottom to top layered wafer construction that can be used to form the magnetic sensor. Any successive shields can provide a number of differently configured shields that can each be tuned with and without high in-plane anisotropic liners that optimize performance of the read element.

It can be appreciated that a wide variety of shields can be constructed from the routine 320 that exhibit various structural and operational characteristics, such as magnetic absorption and spacing from the read element. The routine 320, however, is not limited only to the steps and decisions provided in FIG. 8 as any number of steps and determinations can be added, omitted, and modified to accommodate the fabrication of a precisely tuned magnetic sensor that utilizes highly in-plane anisotropic liner material, such as $CoIr_{17}$, to provide enhanced magnetic shielding from both inside and outside the magnetic sensor.

Further of note is that no particular deposition and formation processes are required to deposit the various layers in the routine 320. For example, atomic layer deposition can be used for some layers while vapor layer deposition can be utilized for other layers. Such an ability to use various formation processes can allow further ability to tune magnetic sensor fabrication with improved manufacturing efficiency and reliability.

It can be appreciated that the configuration and material characteristics of the magnetic sensor described in the present disclosure allows for enhanced data reading performance while maintaining a reduced form factor. The use of varying shield thicknesses and tuned transition regions provide precise spacing within the magnetic sensor and increased magnetic stability. Moreover, the utilization of high in-plane anisotropy material to line the shields allow for the blocking of unwanted magnetic fields and enhancement of magnetizations inside a magnetic element. In addition, while the embodiments have been directed to magnetic sensing, it will be appreciated that the claimed invention can readily be utilized in any number of other applications.

It is to be understood that even though numerous characteristics and configurations of various embodiments of the present invention have been set forth in the foregoing description, together with details of the structure and function of various embodiments of the invention, this detailed description is illustrative only, and changes may be made in detail, especially in matters of structure and arrangements of parts within the principles of the present invention to the full extent indicated by the broad general meaning of the terms in which the appended claims are expressed. For example, the particular elements may vary depending on the particular application without departing from the spirit and scope of the present invention.

What is claimed is:

1. An apparatus comprising a data read element disposed between magnetic shields on an air bearing surface (ABS), the data read element having a first stripe height from the ABS, each magnetic shield having a second stripe height from the ABS dissimilar than the first stripe height, at least one magnetic shield contacting an in-plane anisotropy layer being less magnetically permeable to magnetization along a short plane and more magnetically permeable to magnetization along a long plane and having a third stripe height from the ABS dissimilar from the first stripe height.

2. The apparatus of claim 1, wherein the in-plane anisotropy layer provides anisotropy along a longitudinal plane of the shield orthogonal to the ABS.

3. The apparatus of claim 1, wherein the in-plane anisotropy layer is $CoIr_{17}$.

4. The apparatus of claim 1, wherein a first and second shield are each positioned on opposite sides of the data read element on the ABS.

5. The apparatus of claim 4, wherein a permanent biasing magnet is positioned substantially between the first and second shields distal to the ABS.

6. The apparatus of claim 1, wherein the magnetic shield is an isotropic material.

7. The apparatus of claim 1, wherein the in-plane anisotropy layer extends continuously along the magnetic shield for the third stripe height.

8. The apparatus of claim 7, wherein the second stripe height matches the third stripe height.

9. The apparatus of claim 7, wherein the second stripe height is less than the first stripe height.

10. The apparatus of claim 1, wherein the in-plane anisotropy layer corresponds to a $-K_u$ material.

11. A method comprising positioning a data read element on an air bearing surface (ABS) between magnetic shields, the data read element having a first stripe height from the ABS, each magnetic shield having a second stripe height from the ABS dissimilar than the first stripe height and lining at least one magnetic shield with an in-plane anisotropy layer having a third stripe height from the ABS dissimilar from the first stripe height and resulting in higher pulse amplitude and maintained PW50.

12. The method of claim 11, wherein the shield maintains an equal or lower PW50 value than an isotropic shield with reduced permeability.

13. The method of claim 11, wherein the shield increases a bias force imparted on the data read element by a permanent magnet positioned adjacent the sensing element distal to the ABS.

14. The method of claim 11, wherein the higher pulse amplitude and maintained PW50 is in comparison to an isotropic shield exhibiting anisotropic behavior.

15. A sensor comprising:
   a data read element positioned on an air bearing surface (ABS), the data read element having a first stripe height from the ABS and disposed between first and second magnetic shields, the first magnetic shield having a second stripe height from the ABS dissimilar from the first stripe height, a first thickness at the ABS, and a second thickness distal to the ABS, the first and second thicknesses connected by a first transition region of the first magnetic shield, the second magnetic shield having third and fourth thicknesses connected by a second transition region; and
   a first in-plane anisotropy layer lined along a predetermined third stripe height portion of the first magnetic shield, the third stripe height dissimilar from the first stripe height.

16. The sensor of claim 15, wherein the third thickness is proximal the ABS and the fourth thicknesses is distal the ABS.

17. The sensor of claim 16, wherein the third and fourth thicknesses respectively match the first and second thicknesses.

18. The sensor of claim 15, wherein the first in-plane anisotropy layer is continuous along the first magnetic shield and a second in-plane anisotropy layer has a continuous fourth stripe height along the second magnetic shield, the fourth and third stripe heights being dissimilar.

19. The sensor of claim 18, wherein the fourth and third stripe heights are each measured orthogonal to the ABS.

20. The sensor of claim 15, wherein the second magnetic shield is unlined with anisotropic material.

* * * * *